(12) United States Patent
Lan et al.

(10) Patent No.: US 8,096,048 B2
(45) Date of Patent: Jan. 17, 2012

(54) METHOD FOR FABRICATING MEMS STRUCTURE

(75) Inventors: Bang-Chiang Lan, Taipei (TW); Ming-I Wang, Taipei County (TW); Li-Hsun Ho, Hsinchu County (TW); Hui-Min Wu, Changhua County (TW); Min Chen, Taipei County (TW); Chien-Hsin Huang, Taichung (TW); Tzung-I Su, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/849,168

(22) Filed: Aug. 3, 2010

(65) Prior Publication Data
US 2010/0317138 A1 Dec. 16, 2010

Related U.S. Application Data

(62) Division of application No. 12/202,563, filed on Sep. 2, 2008, now Pat. No. 7,851,975.

(51) Int. Cl.
*B81C 1/00* (2006.01)

(52) U.S. Cl. ......... 29/846; 29/25.01; 257/415; 257/758; 438/52

(58) Field of Classification Search ............... 29/852, 29/594, 832, 846, 847, 25.01; 438/52; 257/414, 257/415, 416, 254, 75 B; 310/328, 330
See application file for complete search history.

(56) References Cited

U.S. PATENT DOCUMENTS

| | | | |
|---|---|---|---|
| 6,872,902 B2 | 3/2005 | Cohn et al. | |
| 2005/0076719 A1 | 4/2005 | Jakobsen et al. | |
| 2005/0087826 A1* | 4/2005 | Rodgers et al. | 257/417 |
| 2007/0040270 A1 | 2/2007 | Coenen | |
| 2009/0049911 A1* | 2/2009 | Fukuda et al. | 73/514.32 |
| 2009/0243004 A1 | 10/2009 | Lan et al. | |

\* cited by examiner

*Primary Examiner* — Livius R Cazan
(74) *Attorney, Agent, or Firm* — WPAT, PC; Justin King

(57) ABSTRACT

A method for fabricating a MEMS is described as follows. A substrate is provided, including a circuit region and a MEMS region separated from each other. A first metal interconnection structure is formed on the substrate in the circuit region, and simultaneously a first dielectric structure is formed on the substrate in the MEMS region. A second metal interconnection structure is formed on the first metal interconnection structure, and simultaneously a second dielectric structure, at least two metal layers and at least one protection ring are formed on the first dielectric structure. The metal layers and the protection ring are formed in the second dielectric structure and the protection ring connects two adjacent metal layers to define an enclosed space between two adjacent metal layers. The first dielectric structure and the second dielectric structure outside the enclosed space are removed to form a MEMS device in the MEMS region.

8 Claims, 3 Drawing Sheets

METHOD FOR FABRICATING MEMS STRUCTURE

CROSS-REFERENCE TO RELATED APPLICATION

This application is a divisional application of and claims the priority benefit of an U.S. application Ser. No. 12/202,563, filed on Sep. 2, 2008, now patented as U.S. Pat. No. 7,851,975. The entirety of the above-mentioned patent application is hereby incorporated by reference herein and made a part of this specification.

BACKGROUND OF THE INVENTION

1. Field of the Invention

The present invention generally relates to a microelectromechanical system (MEMS) structure and a fabricating method thereof, and in particular, to a MEMS structure having a protection ring and a fabricating method thereof.

2. Description of Related Art

A microelectromechanical system (MEMS) is a microelectromechanical device fabricated in a microminiaturized package structure, and the fabricating technique thereof is quite similar to the technique of fabricating integrated circuits (ICs). However, interactions, for example, about mechanics, optics, or magnetic force between the MEMS device and surrounding environment are more than that of the conventional IC. The MEMS device may include micro-sized electromechanical components, such as motors, pumps, valves, switches, capacitors, accelerometers, sensors, capacitive sensors, pixels, microphones, or actuators, etc. The electromechanical components, which are designed based on capacitance principles, usually work out by the coaction between the mechanical structure and the semiconductor device (e.g. IC), thereby resulting in the displacement of the structure to achieve the anticipated effect.

In general, the MEMS is fabricated by forming the devices on a silicon wafer using the semiconductor process technology, and then the MEMS may be integrated with the IC in a manner of a single block. Along with the rapid progress of the semiconductor process and packaging technique, the MEMS are designed in the concept of miniaturization and integration. In order to satisfy the demands, it is the trend to develop the fabrication of the MEMS that can be integrated with the fabrication of the IC chips through the semiconductor process.

However, the conventional process of the MEMS is usually fabricated after the back end of the semiconductor process is finished. In other words, after accomplishing the fabrication of the IC chip, a plurality of thick polysilicon layers are deposited in the region where MEMS to be formed, so as to form the structure of the MEMS device. The MEMS device easily suffers from the stress issue due to the structure formed from polysilicon material. Moreover, polysilicon material is prone to bend under an influence of continuously repeating mechanical stress, such that the life of the device is diminished and the performance thereof is unsatisfying. Although the deposition of the polysilicon layer is a common semiconductor process, polysilicon material will not be formed in the back end of the general semiconductor process. Accordingly, the formation of the MEMS structure utilizing polysilicon as material needs additional procedures, and the fabricating steps and the cost are raised. In practical proceeding, the MEMS structure utilized polysilicon material is also limited to the thickness of the polysilicon layer deposited, which makes a great impact on the device.

SUMMARY OF THE INVENTION

Accordingly, the present invention is directed to a MEMS structure with protection rings.

The present invention is directed to a method for fabricating the MEMS, by which MEMS devices may be integrated with a CMOS process to reduce the fabricating procedures.

The MEMS structure of the present invention includes a fixed part and a movable part. The fixed part is disposed on and connects with a substrate. The movable part including at least two first metal layers, a first protection ring and a first dielectric layer is suspended on the substrate. The first protection ring connects two adjacent first metal layers, so as to define a first enclosed space between the two adjacent first metal layers. The first dielectric layer is disposed in the enclosed space and connects the two adjacent first metal layers.

According to an embodiment of the present invention, the first protection ring substantially corresponds to a profile of each first metal layer.

According to an embodiment of the present invention, the first protection ring comprises metal.

According to an embodiment of the present invention, the fixed part comprises at least two second metal layers, a second protection ring and a second dielectric layer. The second protection ring connects two adjacent second metal layers, so as to define a second enclosed space between the two adjacent second metal layers. The second dielectric layer is disposed in the second enclosed space and connects the two adjacent second metal layers.

According to an embodiment of the present invention, the second protection ring substantially corresponds to a profile of each second metal layer.

According to an embodiment of the present invention, the second protection ring comprises metal.

According to an embodiment of the present invention, the MEMS structure further comprises a metal plug, so as to connect the fixed part and the substrate.

According to an embodiment of the present invention, the MEMS structure comprises a cantilever beam, a bridge, or a membrane.

The method for fabricating the MEMS of the present invention is described as follows. A substrate is provided, which includes a circuit region and a MEMS region separated from each other. A first metal interconnection structure is formed on the substrate in the circuit region, and simultaneously a first dielectric structure is formed on the substrate in the MEMS region. A second metal interconnection structure is formed on the first metal interconnection structure, and simultaneously a second dielectric structure, at least two metal layers and at least one protection ring are formed on the first dielectric structure. The metal layers and the protection ring are formed in the second dielectric structure and the protection ring connects two adjacent metal layers, so as to define an enclosed space between two adjacent metal layers. The first dielectric structure and the second dielectric structure outside the enclosed space are then removed, so as to form a MEMS device in the MEMS region.

According to an embodiment of the present invention, the protection ring substantially corresponds to a profile of each metal layer.

According to an embodiment of the present invention, the protection ring comprises metal.

According to an embodiment of the present invention, the method further comprises forming a semiconductor device in the circuit region before forming the first metal interconnection structure, wherein the semiconductor device connects with the first metal interconnection structure.

According to an embodiment of the present invention, the semiconductor device comprises a CMOS device.

According to an embodiment of the present invention, the MEMS device comprises a suspended part and a fixed part.

According to an embodiment of the present invention, the method further comprises forming a metal plug in the first dielectric structure, wherein the metal plug connects the fixed part and the substrate.

According to an embodiment of the present invention, a structure of the MEMS device comprises a cantilever beam, a bridge, or a membrane.

As mentioned above, the MEMS structure of the present invention includes the protection rings and the dielectric layers to connect two adjacent metal layers, and the residue stress in the metal layers can thus be reduced, thereby the bending problem of the metal layers can be solved. Additionally, since the metal layers and the protection rings constitute a large-area conductor structure, the induced capacitance and the mass can be increased, so as to enhance the sensitivity and the performance of the MEMS.

Moreover, the method for fabricating the MEMS can integrated with the CMOS process, such that the fabricating procedures can be simplified and the throughput can be increased. Hence, the roughness, stress and particle issues impacting on the device can also be improved effectively.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
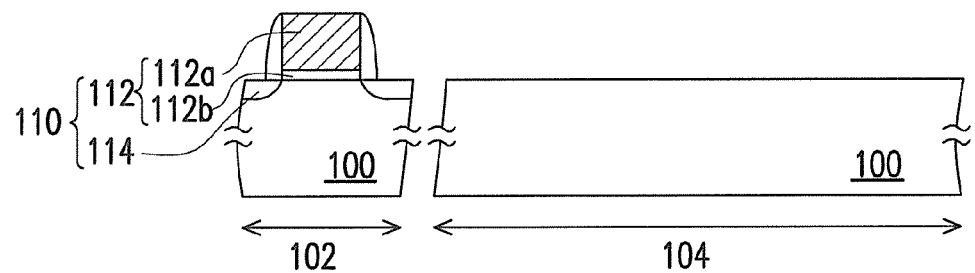
FIGS. 1A-1D depict, in a cross-sectional view, a method for fabricating a MEMS structure according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1D depict, in a cross-sectional view, a method for fabricating a MEMS structure according to an embodiment of this invention. The fabrication of the MEMS structure in the present invention may be integrated with the back end of the CMOS process, so as to simplify manufacturing procedures. Therefore, in the following embodiments, the procedures for fabricating the CMOS transistor, the interconnection process, and the MEMS process are incorporated at the same time to illustrate the present invention.

Referring to FIG. 1A, a substrate 100 is provided, which may be a semiconductor wafer, e.g. an N-type silicon wafer, a P-type silicon wafer, etc. The substrate 100 includes a circuit region 102 and a MEMS region 104, wherein the circuit region 102 and the MEMS region 104 are separated from each other. A transistor 110 is then formed on the substrate 100 in the circuit region 102. The transistor 110 may be a CMOS transistor, which includes a gate structure 112 located on the substrate 100 and doping regions 114 located in the substrate 100 at two side of the gate structure 112. The gate structure 112, for example, includes a gate 112a and a gate dielectric layer 112b disposed between the gate 112a and the substrate 100.

Figure 1B:
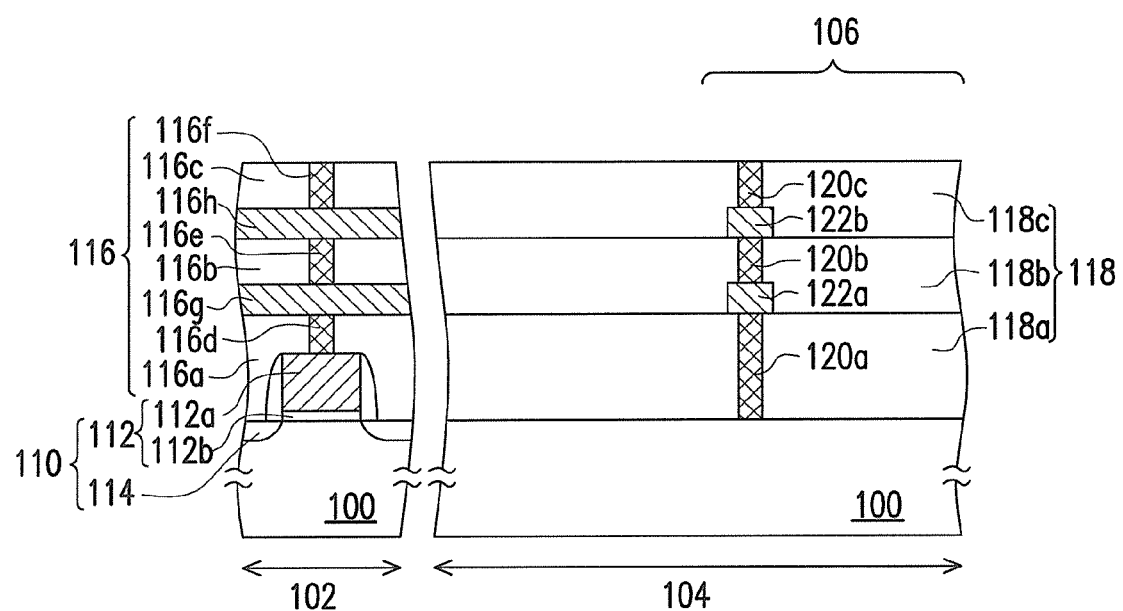

Referring to FIG. 1B, the interconnection process is performed to form a metal interconnection structure 116 in the circuit region 102. A dielectric structure 118 is formed on the substrate 100 in the MEMS region 104, while the metal interconnection structure 116 is formed.

The metal interconnection structure 116 includes dielectric layers 116a, 116b and 116c, plugs 116d, 116e and 116f, and metal layers 116g and 116h. The material of the dielectric layers 116a, 116b and 116c is, for example, an oxide or other suitable dielectrics. The material of the plugs 116d, 116e and 116f is, for example, tungsten, copper or other suitable metals or alloys. The material of the metal layers 116g and 116h is, for example, aluminum, copper or other suitable metals or alloys. The fabrication of the metal interconnection structure 116 is known by one of ordinary skill in the art, and thus, the detail thereof is not described herein.

The dielectric structure 118 may be composed of three dielectric layers 118a, 118b and 118c, but does not limit the scope of this invention. The material of the dielectric structure 118 is, for example, an oxide or other suitable dielectrics. In an embodiment, the MEMS device to be formed may include a fixed part and a movable part, and thus, plugs 120a, 120b and 120c, and metal layers 122a and 122b can be formed optionally in the dielectric structure 118 in the position of the fixed part 106 as a supporting end to connect the fixed part 106 and the substrate 100. The material of the plugs 120a, 120b and 120c is, for example, tungsten, copper, or other suitable metals or alloys. The material of the metal layers 122a and 122b is, for example, aluminum, copper, or other suitable metals or alloys.

Since the process of the circuit region 102 can be integrated with that of the MEMS region 104 in the present invention, the fabrication in the MEMS region 104 can be carried out by the techniques applied to the interconnection process in the circuit region 102. In detail, the dielectric structure 118 is formed in the MEMS region 104, while the dielectric layers 116a, 116b and 116c of the metal interconnection structure 116 are formed in the circuit region 102. The plugs 120a, 120b and 120c are formed in the MEMS region 104, while the plugs 116d, 116e and 116f of the metal interconnection structure 116 are formed in the circuit region 102. The metal layers 122a and 122b are formed in the MEMS region 104, while the metal layers 116g and 116h of the metal interconnection structure 116 are formed in the circuit region 102.

Figure 1C:
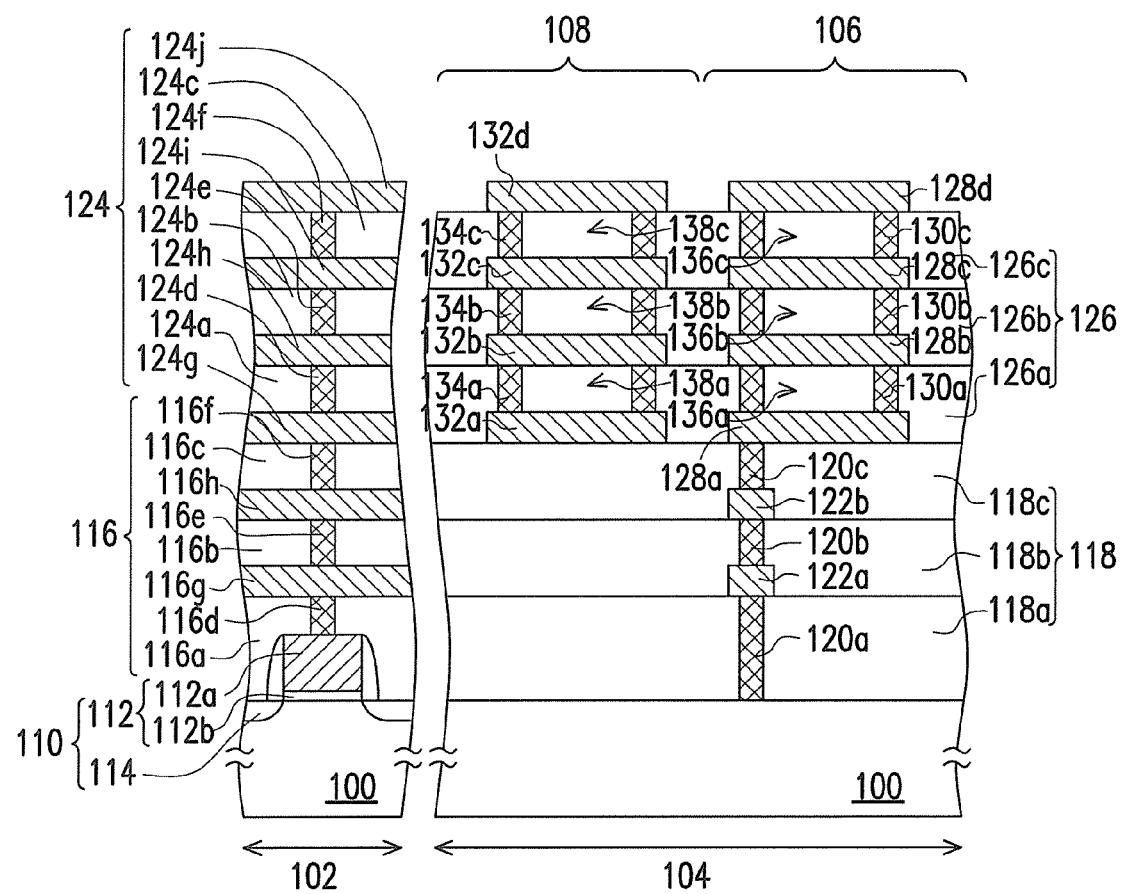

Referring to FIG. 1C, a metal interconnection structure 124 is formed on the metal interconnection structure 116 in the circuit region 102. Simultaneously, a dielectric structure 126, metal layers 128a, 128b, 128c, 128d, 132a, 132b, 132c and 132d, and protection rings 130a, 130b, 130c, 134a, 134b and 134c are formed on the dielectric structure 118 in the MEMS region 104.

The metal interconnection structure 124, similar to the metal interconnection structure 116, includes dielectric layers 124a, 124b and 124c, plugs 124d, 124e and 124f, and metal layers 124g, 124h, 124i and 124j. The material of the dielectric layers 124a, 124b and 124c is, for example, an oxide or other suitable dielectrics. The material of the plugs 124d, 124e and 124f is, for example, tungsten, copper or other suitable metals or alloys. The material of the metal layers 124g, 124h, 124i and 124j is, for example, aluminum, copper or other suitable metals or alloys. The fabrication of the metal interconnection structure 124 is known by one of ordinary skill in the art, and thus, the detail thereof is not described herein.

The dielectric structure 126 may be composed of three dielectric layers 126a, 126b and 126c, but does not limit the scope of this invention. The material of the dielectric structure 126 is, for example, an oxide or other suitable dielectrics.

The metal layers 128a, 128b and 128c stack in the dielectric structure 126, and the metal layers 132a, 132b and 132c stack in the dielectric structure 126, wherein the metal layers 128a, 128b and 128c and the metal layers 132a, 132b and 132c are separated form each other. The metal layer 128d and the metal layer 132d are formed on the dielectric structure 126 corresponding to the position of the metal layer 128c and metal layer 132c, respectively. Each of the protection rings 130a, 130b, 130c, 134a, 134b and 134c connects two adjacent metal layers, so as to define an enclosed space therebetween. Each of the dielectric layers 126a, 126b and 126c disposed in the enclosed space connects two adjacent metal layers, respectively. The protection rings 130a, 130b, 130c, 134a, 134b and 134c, for example, substantially correspond to the profile of each metal layer and connect two adjacent metal layers, respectively. The material of the metal layers 128a, 128b, 128c, 128d, 132a, 132b, 132c and 132d is, for example, aluminum, copper or other suitable metals or alloys. The material of the protection rings 130a, 130b, 130c, 134a, 134b and 134c is, for example, tungsten, copper or other suitable metals or alloys.

As shown in FIG. 1C, in an embodiment, the protection rings 130a, 130b and 130c respectively formed between the metal layers 128a, 128b, 128c and 128d have an annular shape approximating to the profile of the metal layers 128a, 128b, 128c and 128d. The annular protection rings 130a, 130b and 130c may connect to the inside at the edge of the metal layers 128a, 128b, 128c and 128d, respectively. The protection rings 130a, 130b and 130c can encircle the dielectric layers 126a, 126b and 126c in the enclosed spaces 136a, 136b and 136c respectively between two of the metal layers 128a, 128b, 128c and 128d inside the edge of the metal layers 128a, 128b, 128c and 128d.

In an embodiment, the protection rings 134a, 134b and 134c respectively formed between the metal layers 132a, 132b, 132c and 132d have an annular shape approximating to the profile of the metal layers 132a, 132b, 132c and 132d. The annular protection rings 134a, 134b and 134c may connect to the inside at the edge of the metal layers 132a, 132b, 132c and 132d, respectively. The protection rings 134a, 134b and 134c can encircle the dielectric layers 126a, 126b and 126c in the enclosed spaces 138a, 138b and 138c respectively between two of the metal layers 132a, 132b, 132c and 132d inside the edge of the metal layers 132a, 132b, 132c and 132d.

The metal layers 128a, 128b, 128c and 128d and the protection rings 130a, 130b and 130c can be utilized as the structure of the fixed part 106 in the MEMS device. The metal layers 132a, 132b, 132c and 132d and the protection rings 134a, 134b and 134c can be utilized as the structure of the movable part 108 in the MEMS device. In detail, the metal layer 128a formed on the dielectric structure 118 is positioned on the plug 120c, so as to connect with the plug 120c. The metal layers 128b, 128c and 128d and the protection rings 130a, 130b and 130c are formed on the metal layer 128a, and therefore, the fixed part 106 can connect with the substrate 100. The metal layer 132a is formed on the dielectric structure 118 without contacting any plug or any metal layer which is connected with the substrate 100. The metal layers 132b, 132c and 132d and the protection rings 134a, 134b and 134c are formed on the metal layer 132a, and therefore, the movable part 108 cannot connect with the substrate 100 via the plug or the metal layer.

It is noted that the process of the circuit region 102 can be integrated with that of the MEMS region 104 in the present invention, and the fabrication in the MEMS region 104 can thus be carried out by the techniques applied to the interconnection process in the circuit region 102. For further details, the dielectric structure 126 is formed in the MEMS region 104, while the dielectric layers 124a, 124b and 124c of the metal interconnection structure 124 are formed in the circuit region 102. The protection rings 130a, 130b, 130c, 134a, 134b and 134c are formed in the MEMS region 104, while the plugs 124d, 124e and 124f of the metal interconnection structure 124 are formed in the circuit region 102. The metal layers 128a, 128b, 128c, 128d, 132a, 132b, 132c and 132d are formed in the MEMS region 104, while the metal layers 124g, 124h, 124i and 124j of the metal interconnection structure 124 are formed in the circuit region 102.

Figure 1D:
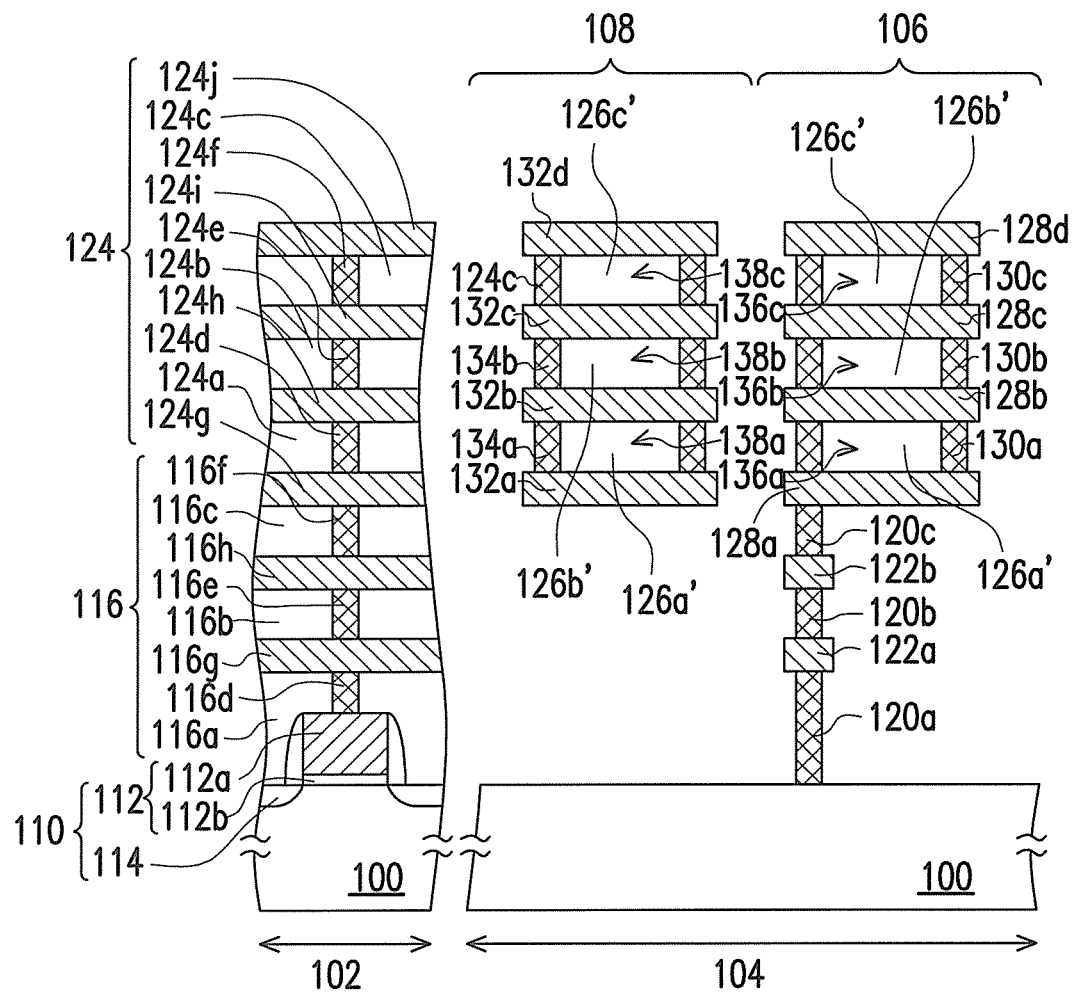

Referring to FIG. 1D, the dielectric structure 118 and a partial dielectric structure 126 are removed, so as to form the MEMS device in the MEMS region 108, that is, to accomplish the fabrication of the MEMS structure according to the present invention. After the dielectric structure 118 and the partial dielectric structure 126 are removed, the fixed part 106 of the MEMS device is fixed on the substrate 100 via the plugs 120a, 120b and 120c and the metal layers 122a and 122b while the movable part 108 is suspended on the substrate 100. The method for removing the dielectric structure 118 and the partial dielectric structure 126 is, for example, isotropic etching. In an embodiment, the method for removing the dielectric structure 118 and the partial dielectric structure 126 is wet etching, and the utilized etchant can be hydrofluoric acid (liquid HF), vapor HF, or vapor $XeF_2$.

Since the protection rings 130a, 130b, 130c, 134a, 134b and 134c which are formed in the procedure illustrated in FIG. 1C may connect the adjacent metal layers 128a, 128b, 128c, 128d, 132a, 132b, 132c and 132d, the dielectric material disposed in the enclosed spaces 136a, 136b, 136c, 138a, 138b and 138c can be protected by the protection rings 130a, 130b, 130c, 134a, 134b and 134c. That is to say, during the etching process of removing the partial dielectric structure 126, the dielectric layers 126a', 126b' and 126c' can be retained in the enclosed spaces 136a, 136b, 136c, 138a, 138b and 138c, when the dielectric layers 126a, 126b and 126c outside the protection rings 130a, 130b, 130c, 134a, 134b and 134c are removed.

Furthermore, an isolation structure (not shown) may be optionally formed between the circuit region 102 and the MEMS region 104 when the metal interconnection structures 116 and 124 are formed, such that the dielectric layers disposed in the circuit region 102 can be protected from the etching process of removing the dielectric material. The formation of the isolation structure is, for example, simultaneous with the formation of each corresponding layer in the metal interconnection structures 116 and 124.

In an embodiment, the movable part 108 suspended on the substrate 100 may be further connected with a flexible elastic component (not shown), e.g. a spring. The movable part 108 may be vibrated in response to an external disturbance, and accordingly the induced capacitance between the fixed part 106 and the movable part 108 is altered to generate an electrical signal. When the flexible elastic component is disposed between the lateral of the movable part 108 and the member other than the movable part 108, the MEMS device may be utilized for detecting the horizontal vibration of the movable part 108 along the X- or Y-axis. When the flexible elastic component is disposed between the bottom metal layer 132a and the substrate 100, the MEMS device may be utilized for detecting the vertical vibration of the movable part 108 along the Z-axis.

Certainly, the construction of the MEMS structure and the MEMS device are not particularly limited in this invention. The MEMS structure formed in the foregoing embodiments can be any arbitrary structure, such as a cantilever beam, a bridge, or a membrane. The MEMS device can be any minimal MEMS device, such as an accelerometer, a gyroscope, an oscillator, a microphone, a switch, a sensor, or an actuator. Moreover, the amounts of the metal layers, the protection rings and the plugs which constitute the metal interconnection structure and the MEMS device structure are not limited to those shown in FIG. 1D. In other embodiments, one of ordinary skill in the art can modify the amounts of the metal layers, the protection rings and the plugs can be varied in accordance with the individual requirement.

A MEMS structure according to an embodiment of the present invention is then illustrated with the structure shown within the MEMS region 104 of FIG. 1D. It should be noted that the details of the materials, effects and forming methods of each component in the MEMS structure have been described explicitly in the foregoing embodiments, and will be omitted hereinafter.

Referring to FIG. 1D again, the MEMS structure includes the fixed part 106 and the movable part 108. The fixed part 106 is disposed on the substrate 100, and connects with the substrate 100. The movable part 108 is disposed at one side of the fixed part, and may be suspended on the substrate 100. In an embodiment, the MEMS structure may be any arbitrary structure, such as a cantilever beam, a bridge, or a membrane.

The fixed part 106 includes the plugs 120a, 120b and 120c, the metal layers 122a, 122b, 128a, 128b, 128c and 128d, the protection rings 130a, 130b and 130c, and the dielectric layers 126a', 126b' and 126c'. The metal layers 128a, 128b, 128c and 128d may be formed on the substrate 100 in a stacked manner. Each of the protection rings 130a, 130b and 130c connects two adjacent metal layers 128a, 128b, 128c and 128d, so as to define enclosed spaces 136a, 136b and 136c therebetween, respectively. The shape of the protection rings 130a, 130b and 130c, for example, substantially corresponds to the profile of each metal layers 128a, 128b, 128c and 128d. In an embodiment, the protection rings 130a, 130b and 130c have an annular shape approximating to the profile of the metal layers 128a, 128b, 128c and 128d, and may connect to the inside at the edge of the metal layers 128a, 128b, 128c and 128d, respectively. The dielectric layers 126a' 126b' and 126c' are disposed in the enclosed spaces 136a, 136b and 136c respectively, so as to connect two adjacent metal layers 128a, 128b, 128c and 128d. The plugs 120a, 120b and 120c, and the metal layers 122a and 122b are disposed between the metal layer 128a and the substrate 100, as a supporting end to connect the fixed part 106 and the substrate 100. In an embodiment, the plug 120a connects the substrate 100 and the metal layer 122a, the plug 120b connects the metal layer 122a and the metal layer 122b, and the plug 120c connects the metal layer 122b and the metal layer 128a.

The movable part 108 includes the metal layers 132a, 132b, 132c and 132d, the protection rings 134a, 134b and 134c, and the dielectric layers 126a', 126b' and 126c'. The metal layers 132a, 132b, 132c and 132d may be formed on the substrate 100 in a stacked manner. Each of the protection rings 134a, 134b and 134c connects two adjacent metal layers 132a, 132b, 132c and 132d, so as to define enclosed spaces 138a, 138b and 138c therebetween, respectively. The shape of the protection rings 134a, 134b and 134c, for example, substantially corresponds to the profile of each metal layers 132a, 132b, 132c and 132d. In an embodiment, the protection rings 134a, 134b and 134c have an annular shape approximating to the profile of the metal layers 132a, 132b, 132c and 132d, and may connect to the inside at the edge of the metal layers 132a, 132b, 132c and 132d, respectively. The dielectric layers 126a' 126b' and 126c' are disposed in the enclosed spaces 138a, 138b and 138c respectively, so as to connect two adjacent metal layers 132a, 132b, 132c and 132d.

Since two adjacent metal layers are connected by the protection ring and the dielectric layer, the dielectric layer can compensate the residue stress of the metal layers so as to prevent the metal layer from bending. Further, the structure which is composed of the metal layers and the protection rings is a conductor with a large area, so as to enhance the induced capacitance between the fixed part 106 and the movable part 108 and to increase the mass. Accordingly, the sensitivity of the MEMS can be improved effectively. In addition, the structures of the fixed part 106 and the movable part 108 described above can be fabricated simultaneously with the interconnection process in the circuit region, so as to simplify the fabrication process, to increase the throughput, and to reduce the issues regarding roughness, stress and particles.

In view of the above, the MEMS structure and the fabricating method thereof at least have the following advantages.

1. The MEMS structure in the foregoing embodiments have an increased area for inducing capacitance and an increased mass, and can reduce the residue stress of the material, such that the sensitivity and the performance of the device can be improved efficiently.

2. The method for fabricating the MEMS in the foregoing embodiments can easily incorporated into the present semiconductor process, that is, the integrated circuit and the MEMS device can be fabricated at the same time by the techniques of the existing semiconductor process. Thus, the effects of simplifying the fabrication process and enhancing throughput can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a MEMS, comprising:
providing a substrate, comprising a circuit region and a MEMS region separated from each other;
forming a first metal interconnection structure on the substrate in the circuit region, and simultaneously forming a first dielectric structure on the substrate in the MEMS region;
forming a second metal interconnection structure on the first metal interconnection structure, and simultaneously forming a second dielectric structure, at least two metal layers and at least one protection ring on the first dielectric structure, wherein the metal layers and the protection ring are formed in the second dielectric structure and the protection ring connects two adjacent metal layers, so as to define an enclosed space between the two adjacent metal layers; and
removing the first dielectric structure and the second dielectric structure outside the enclosed space, so as to form a MEMS device in the MEMS region.

2. The method according to claim 1, wherein the protection ring substantially corresponds to a profile of each metal layer.

3. The method according to claim 1, wherein the protection ring comprises metal.

4. The method according to claim 1, further comprising forming a semiconductor device in the circuit region before forming the first metal interconnection structure, wherein the semiconductor device connects with the first metal interconnection structure.

5. The method according to claim 4, wherein the semiconductor device comprises a complementary metal oxide semiconductor (CMOS) device.

6. The method according to claim 1, wherein the MEMS device comprises a suspended part and a fixed part.

7. The method according to claim 6, further comprising forming a metal plug in the first dielectric structure, wherein the metal plug connects the fixed part and the substrate.

8. The method according to claim 1, wherein a structure of the MEMS device comprises a cantilever beam, a bridge, or a membrane.

* * * * *